(12) United States Patent
Powell et al.

(10) Patent No.: US 10,048,532 B2
(45) Date of Patent: Aug. 14, 2018

(54) DISPLAY EDGE EMISSION COMPENSATION

(71) Applicant: Microsoft Technology Licensing, LLC, Redmond, WA (US)

(72) Inventors: Karlton Powell, Lake Stevens, WA (US); Rajesh Dighde, Redmond, WA (US); Ying Zheng, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/346,643

(22) Filed: Nov. 8, 2016

(65) Prior Publication Data

US 2018/0128973 A1   May 10, 2018

(51) Int. Cl.
| | | |
|---|---|---|
| *G02F 1/1335* | (2006.01) | |
| *G02B 6/08* | (2006.01) | |
| *G02B 6/06* | (2006.01) | |
| *G02F 1/1333* | (2006.01) | |

(52) U.S. Cl.
CPC ......... *G02F 1/133524* (2013.01); *G02B 6/06* (2013.01); *G02B 6/08* (2013.01); *G02F 2001/133388* (2013.01)

(58) Field of Classification Search
None
See application file for complete search history.

(56) References Cited

U.S. PATENT DOCUMENTS 9,123,266 B2 *  9/2015  Bastani ................... G09F 13/04
2004/0108806 A1   6/2004  Cok et al.
2006/0077544 A1 *  4/2006  Stark ................... G02F 1/13336
                                                          359/448

(Continued)

FOREIGN PATENT DOCUMENTS

CN        204480603 U        7/2015

OTHER PUBLICATIONS

"iPhone rumours: Apple to reinvent phone with edgeless display and no home button next year", Published on: May 2, 2016 Available at: http://www.telegraph.co.uk/technology/2016/05/12/iphone-rumours-apple-to-reinvent-phone-with-edgeless-display-and/.

(Continued)

*Primary Examiner* — Mike Stahl
(74) *Attorney, Agent, or Firm* — Lempia Summerfield Katz LLC

(57) ABSTRACT

A display includes a cover having a front face that defines a normal of the display and further having a sidewall that meets the front face to define an edge of the display, and a display module disposed behind the cover. The display module includes a substrate and a plurality of pixels supported by the substrate. The substrate includes a curved portion along the edge, the curved portion bending rearward such that peripheral pixels of the plurality of pixels are disposed laterally between the substrate and the sidewall. The display further includes edge compensation means for compensating for a curvature of the curved portion to direct light from the peripheral pixels toward the normal of the display. An extent to which the edge compensation means compensates for the curvature varies in accordance with lateral position of the peripheral pixels along the curved portion.

22 Claims, 8 Drawing Sheets

(56) References Cited

U.S. PATENT DOCUMENTS

| | | |
|---|---|---|
| 2006/0251365 A1 | 11/2006 | Brewer |
| 2008/0232751 A1 | 9/2008 | Tabor |
| 2009/0085831 A1* | 4/2009 | Odoi ................. G02F 1/133524 345/1.3 |
| 2011/0255301 A1* | 10/2011 | Watanabe ........... G02F 1/13336 362/558 |
| 2012/0008340 A1 | 1/2012 | Tomotoshi et al. |
| 2013/0301263 A1* | 11/2013 | Yamanaka ................ G09F 9/35 362/235 |
| 2014/0037257 A1 | 2/2014 | Yang et al. |
| 2014/0092283 A1 | 4/2014 | Yang et al. |
| 2014/0092346 A1 | 4/2014 | Yang et al. |
| 2014/0126183 A1* | 5/2014 | Geng .................... G06F 1/1641 362/97.1 |
| 2014/0218956 A1* | 8/2014 | Wu ..................... G02F 1/13336 362/554 |
| 2014/0320543 A1* | 10/2014 | Oh ....................... H01L 27/326 345/690 |
| 2014/0355227 A1 | 12/2014 | Lim |
| 2015/0001483 A1 | 1/2015 | Namkung et al. |
| 2015/0092442 A1 | 4/2015 | Wu |
| 2015/0093086 A1 | 4/2015 | Wu |
| 2015/0378094 A1 | 12/2015 | Lu et al. |
| 2016/0196778 A1* | 7/2016 | Cha .......................... G09G 3/20 345/694 |
| 2016/0238785 A1* | 8/2016 | Park ..................... G02B 6/0076 |

OTHER PUBLICATIONS

Vincent, James, "Chinese manufacturers are trying to kill the smartphone bezel", Published on: Mar. 25, 2015 Available at: ittp://www.theverge.com/2015/3/25/8287663/smartphone-bezel-less-design-china.

"Universal Display's Borderless Flexible OLED Panel 'Best in Show' at SID Display Week", Published on: May 30, 2013 Available at: http:industrial-printing.net/content/universal-displays-border-less-flexible-oled-panel-best-show-sid-display-week#. Vzq_0-J94dU.

Lopez, Napier, "Dell brings its edgeless display to the powerhouse XPS 15", Published on: Oct. 8, 2015 Available at: http://thenextweb.com/gadgets/2015/10/08/dell-brings-its-edgeless-display-to-the-powerhouse-xps-15/#gref.

"International Search Report and Written Opinion Issued in PCT Application No. PCT/US2017/059137", dated Feb. 16, 2018, 10 Pages.

* cited by examiner

DISPLAY EDGE EMISSION COMPENSATION

DESCRIPTION OF THE DRAWING FIGURES

For a more complete understanding of the disclosure, reference is made to the following detailed description and accompanying drawing figures, in which like reference numerals may be used to identify like elements in the figures.

Figure 1:
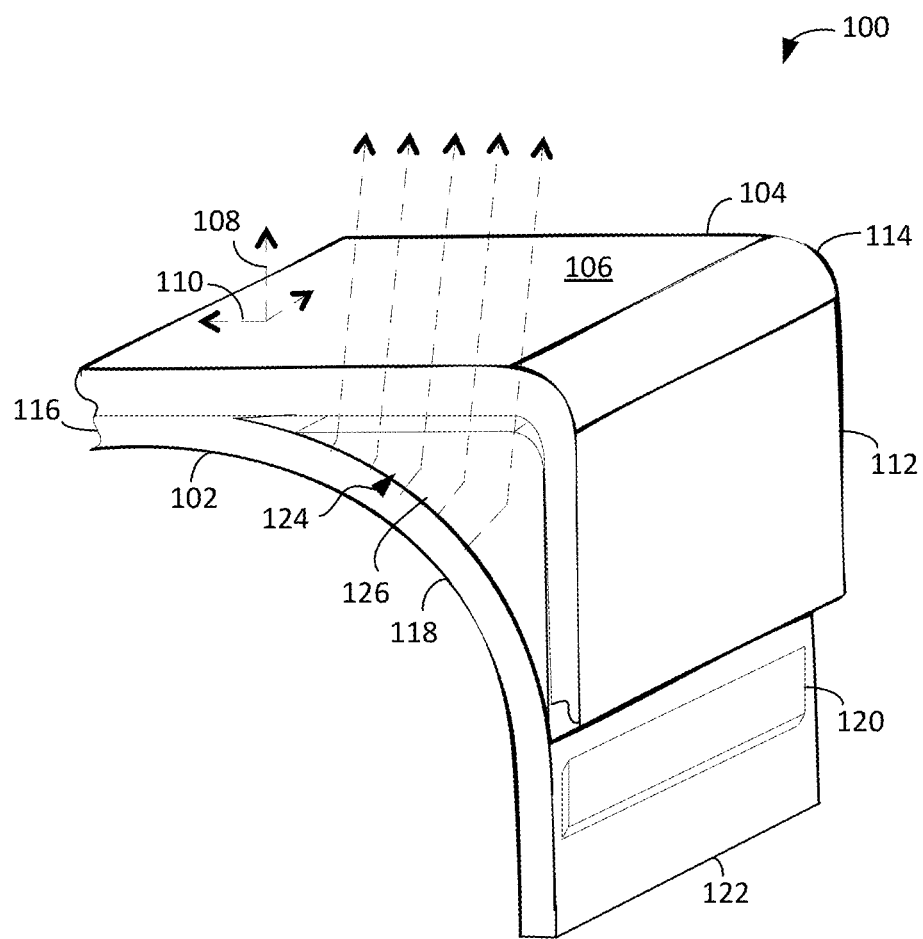
FIG. 1 is a partial, schematic, perspective view of a display having edge emission compensation in accordance with one example.

The disclosed displays and devices may assume various forms. Specific examples are illustrated in the drawing (and are hereafter described) with the understanding that the disclosure is intended to be illustrative, and is not intended to limit the invention to the specific examples described and illustrated herein.

DETAILED DESCRIPTION

Displays have a display area and a display border. The display area corresponds with an active area (or display active area) in which an image is provided by an array of pixels. The display border corresponds with the peripheral portions of the display located outside of the display active area. In some cases, the display border is covered by a bezel or other enclosure. For instance, a cover glass of the display may extend beyond the display area and across the display border. The size of the display border is set by the distance between the last pixel in the display area to the edge of the enclosure.

Displays that eliminate, minimize, or otherwise reduce the size of the display border are described. The border reduction is provided by a display module bent or curved along edges of the display. The displays are configured to compensate for the curvature of the display module so that an image is accurately emitted along the edge of the display. The image along the display edge is accurately transferred from the curved display module to the main plane of the display. To a viewer, the image along the display edge may thus appear flat with the main display plane, rather than curved rearward, as with a book binder seam. In some cases, the edge emission compensation is capable of attaining a zero border display (i.e., a display that exhibits no display border).

Multiple structures are described for achieving such edge emission compensation. The structures may include an optical element to achieve the edge emission compensation. In some examples, the display includes a guide plate that coherently redirects light from peripheral pixels along or otherwise toward a display normal. In other cases, the edge emission compensation is provided by a structural reorientation of pixels. For instance, the edge emission compensation is achieved by a banked surface on which the peripheral pixels are disposed. In still other cases, the compensation involves both optical adjustments and structural reorientation of pixels. These structural (optical and non-optical) aspects of the displays stand in contrast to software and other post-processing adjustments directed to the challenge of reducing the display border.

Bending the edges of a display module allows circuitry disposed along the edges to be disposed at and along a cover sidewall. The display module may be curved at the edges to an extent that the circuitry is oriented along (e.g., in parallel with) the sidewall. The reorientation renders the thickness of the circuitry, rather than a lateral width, determinative of the positioning of the pixels along the edge.

The displays may be incorporated into a wide variety of devices. The structures providing the edge emission compensation are well suited for devices of various sizes and form factors. In some cases, the displays are part of a portable electronic device, such as a smartphone, tablet or other device having a touchscreen. The devices may be configured for other end use applications of a wide variety of devices. For instance, the devices may be display devices, such as monitors or televisions, or devices in which a display is a peripheral or other component, such as a laptop. The displays are well suited for still other applications and usage scenarios.

FIG. 1 is a schematic, partial view of a display 100 having edge emission compensation in accordance with one example. The display 100 includes a display module 102 and a cover 104. The cover 104 may include one or more components that provide a housing or otherwise enclose the display module 102 and other components of the display 100. For instance, the cover 104 may include a tray or case (not shown) in which the components of the display 100 are disposed. A front face 106 of the cover 104 defines a normal 108 of the display 100. The display normal 108 extends forward (e.g., toward a viewer) such that the display module 102 may be considered to be disposed behind the cover 104. In this case, the front face 106 of the cover 104 is flat. The front face 106 accordingly lies in a plane 110 orthogonal to the normal 108. The front face 106 may be curved or otherwise non-planar in other cases. The normal 108 may nonetheless be defined or established in such non-planar cases as, e.g., a primary viewing axis or other direction along which the light is predominantly directed.

The front face 106 of the cover 104 may be or include a cover glass layer. The front face 106 may be composed of one or more layers of glass (e.g., chemically strengthened or non-strengthened glass) and/or plastic (e.g., acrylic). In other examples, the external display layer of the electronic device 100 may be an integral layer or component of the display module 102. Other materials may be used. For example, the front face 106 and/or other components of the cover 104 may be composed of various polymers. The cover glass layer (and/or other elements of the cover 104) may be configured with an array of touch sensors to present a touch-sensitive surface. In other cases, the front face 106 is not touch-sensitive. Further still, touch sensing may be included within the stack or cells of the display module 102.

The cover 104 also includes a sidewall 112 that meets the front face 106 to define an edge 114 of the display 100. In the example of FIG. 1, the front face 106 and the sidewall 112 are integrally formed. In other cases, the front face 106 and the sidewall 112 are discrete components. Only a portion of the sidewall 112 is shown for ease in illustrating other elements of the display 100.

The cover 104 may include additional or alternative components. For example, the cover 104 may include multiple components along the sidewall 112, such as an antenna strip or other enclosure. The configuration, construction, thickness, materials, and other characteristics of the cover 104 may vary widely, for instance, in accordance with the device in which the display 100 is incorporated.

The display module 102 may include a number of constituent films, layers, or other components. The layers may be arranged in a stack. Some of the layers may be configured to provide optical functionality, such as one or more polarizers, retarder layers, and color filters. The display module 102 includes one or more layers directed to light emission or generation. For example, the display module 102 may include an organic light emitting diode (OLED) display panel. The OLED display panel includes a substrate on which OLED cells are formed or otherwise disposed. In other cases, the display module 102 includes a backlight unit or panel. The display module 102 may also include one or more layers or other components directed to non-optical functionality, such as touch sensing. For example, the display module 102 may include one or more layers that provide structural or other support, such as spacers. The composition and other characteristics of the display module 102 may vary in alternative or additional ways. For example, various types of displays may be used, including, for instance, flexible liquid crystal display (LCD), plasma displays, quantum dot light-emitting diode (QLED), and other electroluminescent displays. The display module 102 may be (1) an active emissive type of display, such as flexible or bendable OLED display, (2) a reflective or absorptive type of display, such as an e-ink display, or (3) a passive diffusively reflective type of display, such as printed matter on media, i.e., paper or polymer substrate, each of which may be utilized in conjunction with edge compensation means 124 to provide a substantially borderless display.

The display module 102 includes a plurality of pixels. The pixels may be arranged in an array (e.g., a grid) on a substrate 116 of the display module 102. The pixels may be formed or deposited on the substrate 116, or be otherwise supported by the substrate 116. The pixels are distributed across the substrate 116 to establish an active area of the display 100 from which light is emitted forward, e.g., toward the viewer. Each pixel may be configured as an emissive cell, such as an OLED pixel. In such cases, light is respectively generated by each pixel or cell. In other cases, the pixels modulate the light generated by another component of the display module 102. For example, the display module 102 may include a backlight unit and a liquid crystal display (LCD) panel having a pixel array that modulates the light generated by the backlight unit. The pixels are not depicted in FIG. 1 for ease in illustrating other elements and aspects of the display 100.

The substrate 116 of the display module 102 may be composed of various materials. In some cases, the substrate 116 includes one or more polymer materials, such as polyimide (PI), polyethylene naphthalate (PEN), and polyethylene terephthalate (PET). Alternative materials include glass, stainless steel, and other metal (e.g., aluminum) foil. The substrate 116 may be a unitary or composite structure. In some cases, the substrate 116 may include a base substrate composed of one or more of the above-referenced materials and one or more encapsulation layers (e.g., an emitting side encapsulation layer) composed of, for instance, glass, plastic (e.g., PET or polyester films), or other thin film encapsulation materials. The substrate 116 may be flexible or otherwise capable of bending or deformation. For instance, in some cases (e.g., certain bendable OLED displays), the substrate 116 and display module 102 may be capable of being curved from flat to a radius that falls in a range as low as from about 3 mm to about 5 mm. In other cases (e.g., certain flexible OLED displays), the substrate 116 and display module 102 may be capable of being curved from flat to a radius that falls in a range as low as from about 1 mm to about 3 mm.

The substrate 116 includes a curved portion 118 along each sidewall 112 of the cover 104. The curved portion 118 may thus correspond with the periphery of the substrate 116. As shown in FIG. 1, the curved portion 118 bends rearward, away from the front face 106 in this case. As a result, some of the pixels are disposed laterally between the substrate 102 and the sidewall 112. Such pixels may be referenced herein as peripheral pixels to acknowledge the location of such pixels in the periphery of the substrate 114. Examples of peripheral pixels are described and shown below in connection with FIGS. 2-4.

The curvature of the substrate 116 allows control circuitry 120 to be disposed at, and oriented along, the sidewall 112. The control circuitry 120 may include gate-in-panel driver or other circuitry for driving the pixels of the display module 102. For example, the control circuitry 120 may be configured to drive respective rows or columns of the pixel array. The control circuitry 120 is mounted on or otherwise supported by the substrate 116. For example, the control circuitry may include one or more thin film transistor circuits formed, deposited, or otherwise disposed on the substrate 116. In the example of FIG. 1, the curved portion 118 of the substrate 116 is curved to an extent that the substrate 116 eventually runs in parallel with the sidewall 112. The control circuitry 120 may be located sufficiently close to an end 122 of the substrate 116 so that the control circuitry 120 also runs in parallel with the sidewall 112. In other cases, the control circuitry 120 may not run parallel with the sidewall 112, but nonetheless still be considered to be oriented along the sidewall 112.

The orientation and positioning of the control circuitry 120 eliminates, minimizes or reduces the effective area along the front face 106 corresponding with, and consumed by, the control circuitry 120. As shown in FIG. 1, the effective area may correspond with the thickness, or height, of the control circuitry 120. In this way, neither one of the width dimensions of the control circuitry 120 is determinative of the extent to which the control circuitry 120 takes up space along the edge 112 of the cover 104.

The display 100 includes one or more edge compensation means 124 for compensating for the curvature of the curved portion 118 of the substrate 116. The edge compensation means 124 directs light from the peripheral pixels toward the normal 108 of the display 100. As shown in FIG. 1, the curvature of the substrate 116 causes the light emitted from the pixels to be initially directed at an angle from the display normal 108. Redirecting the light toward the display normal 108 reduces the angle at which the light is offset from the display normal 108. The extent of the reduction may vary. The redirected light may thus not be oriented in exactly the direction of the display normal 108.

The redirection provided by the edge compensation means 124 eliminates or reduces the apparent border of the display 100. The display border may be reduced to zero or near zero. As shown in FIG. 1, the light emitted by the peripheral pixels passes through the front face 106 at or near the edge 114. The display area may thus extend outward to the edge 114. The area of the display border formerly present due to the lateral extent of, for instance, control circuitry is substantially reduced or eliminated. As described herein, such borderless (e.g., substantially borderless) displays are provided by reducing the visibility to the viewer by geometrically curving the peripheral portion of display from view, enabling the pixels along the resulting arc region (the peripheral pixels) to be mapped or transferred to a primary plane of the pixels of the display. The display thus appears to a viewer to continue to the edge of the display 100.

In the example of FIG. 1, the edge compensation means 124 includes a guide plate 126 disposed between the display module 102 and the cover 104. The guide plate 126 optically redirects the light from the peripheral pixels through wave guiding (e.g., total internal reflection). Examples of guide plates are described below. The guide plate 126 may be elongated to extend along the length of the edge 114 of the cover 104. The guide plate 126 may be wedge-shaped to follow the contour of the substrate 116. The guide plate 126 may be configured as a fiber optic or other faceplate, as described below.

In other cases, the edge compensation means 124 redirects the light via a structural reorientation of the peripheral pixels. In still other cases, the light is redirected via a combination of optical and structural means. Examples of the edge compensation means 124 are described and shown below in connection with FIGS. 2-7.

The extent to which the edge compensation means 124 compensates for the curvature varies in accordance with lateral position of the peripheral pixels along the curved portion 118. The variance in compensation is schematically shown in FIG. 1 by an extent to which the primary propagation direction of the light changes. In the example of FIG. 1, the change in primary propagation direction varies in accordance with the initial angle at which the light is emitted from the peripheral pixels. The initial angle varies in accordance with the lateral position of the peripheral pixel. The initial angle varies due to the curvature of the substrate 116. The initial angle may be increasingly offset from the display normal 108 as the distance to the edge 114 decreases. For instance, the edge compensation means 124 provides greater redirection with increasing initial angle.

A gap may be disposed between the guide plate 126 and the front cover 104. The gap may be filled with material having a different refractive index than one or more of the adjacent materials. For example, material having a refractive index falling in a range from about 1.4 to about 1.7 may be used. Such a gap may be utilized to compensate for the optical path difference due to the thickness of the emitting side protective layer of the display module 102, which may typically be around 150 μm of polymer, e.g., PET for a flexible OLED display, such that the light emitting from the top of the edge compensation means 124 appears, to a viewer, to be emanating substantially near or at the same level as the emitting layer of pixels within the display optical stack. However, this gap may be omitted if the gap offset is deemed to have an acceptably low visibility for a given design.

The configuration, construction, and other characteristics of the display module 102 and other components of the display 100 may vary from the examples described above. For instance, the display 100 may include additional components between the display module 102 and the cover 104, including, for instance, a frame on or in which the layers and other components of the display module 102 are disposed. In one embodiment, the edge compensation means 124 may be configured to map a portion of pixels along the resulting arc region of the display toward a viewer viewing the cover 104 while mapping a further portion of pixels along the arc region of the display toward a viewer viewing the edge 114. For example, a coherent guide plate may provide the edge compensation means 124, and may have propagation direction aligned at an angle (e.g., one falling in a range from about 20 degrees to about 45 degrees) from display normal 108, toward corner of display 100. A portion of the peripheral pixels may be mapped to support displaying content on top (or in front), and a portion of the peripheral pixels may be mapped to support displaying content to the side. This enables the same display to support multiple display modes, such as top-only viewing, or side-only viewing, or both simultaneously.

Figure 2:
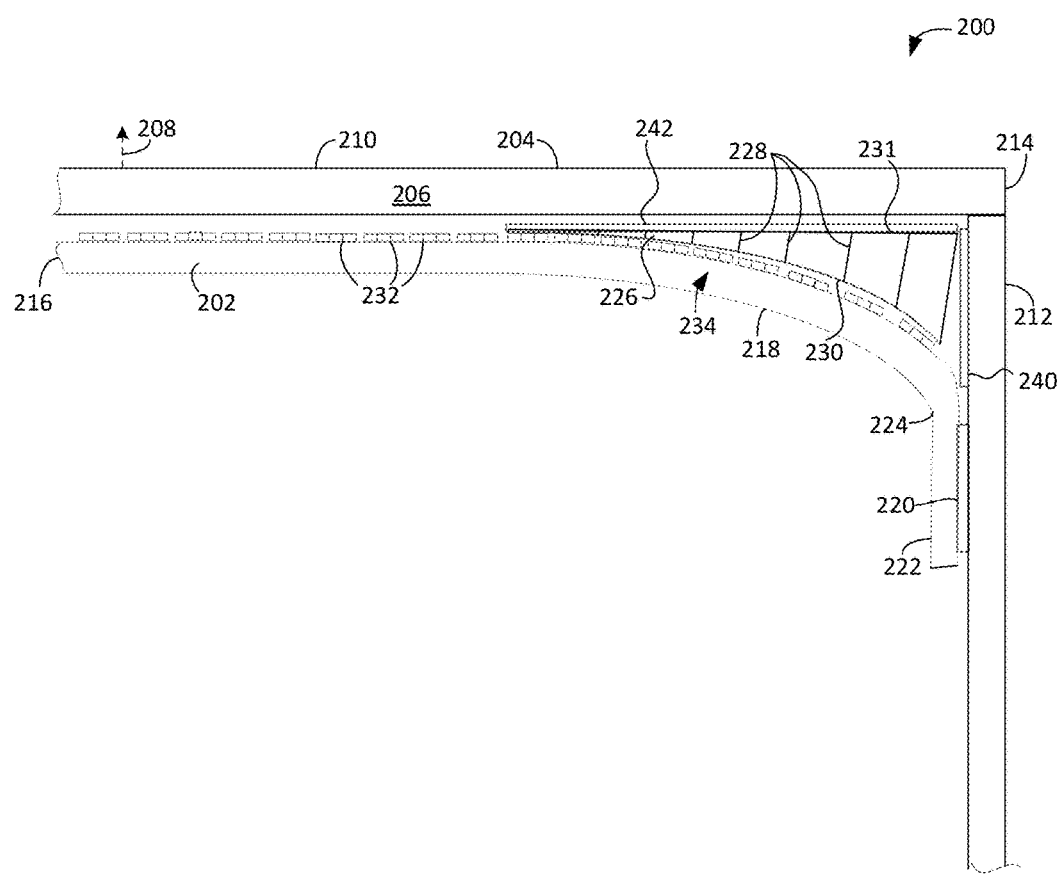
FIG. 2 is a partial, schematic, side view of a display having a coherent guide plate for edge emission compensation in accordance with one example.

FIG. 2 depicts a display 200 with edge emission compensation in accordance with one example. The display 200 may be similar in many respects to the examples described above in connection with FIG. 1. For instance, the display 200 includes a display module 202 and a cover 204 having a front transparent cover 206, such as a cover glass. A display normal 208 extends orthogonally from a planar surface 210 defined by the transparent cover 206.

The example of FIG. 2 differs in several respects. In this case, the transparent cover 206 is not integrally formed with a sidewall 212 of the cover 204. The transparent cover 206 is instead secured to the sidewall 212. For example, the transparent cover 206 may be adhesively or otherwise affixed to the sidewall 212. In this example, the transparent cover 206 extends laterally over a top end of the sidewall 212. As a result, an edge 214 of the transparent cover 206 defines the edge of the display 200. The arrangement of the transparent cover 206 and the sidewall 212 may vary in other cases. For example, the transparent cover 206 may be secured to the sidewall 212 via another component of the display 200. The sidewall 212 may be one of several components of the cover 204 separate and distinct from the transparent cover 206.

The display module 202 includes a substrate 216 having a curved portion 218 near the display edge 214. As described above, the curvature allows control circuitry 220 disposed on the substrate 216 to be oriented along the sidewall 212. In this case, the control circuitry 220 and corresponding end section 222 of the substrate 216 are oriented in parallel with the sidewall 212. To that end, the curved portion 218 includes a crease or sharp bend 224 that separates the end section 222 from the remainder of the substrate 216. The curved portion 218 may include other types of discontinuities to increase or decrease curvature as desired.

The display 200 includes a guide plate 226 that optically compensates for the curvature of the curved portion 218. In this case, the guide plate 226 includes a fiber optic faceplate disposed between the substrate 216 and the transparent cover 206. The guide plate 226 includes a bundle of fibers 228. The fiber bundle of the guide plate 226 is machined or otherwise configured with a rear surface 230 and a front surface 231. Each fiber 228 extends forward from the rear surface 230 to the front surface 231. The rear surface 230 is curved or otherwise shaped to match the curvature of the curved portion 218 of the substrate 216. The front surface 231 may be cut at an angle offset from the plane that would otherwise be the front face of the faceplate. In some cases, the angle at which the faceplate is cut, the angle of propagation of the guide plate with respect to display surface normal, falls within a range from about 20 degrees to about 25 degrees.

The display module 202 includes an array of pixels 232. Some of the pixels 232 are located in a peripheral area 234 of the display 200. Such peripheral pixels 232 may be disposed on the curved portion 218 of the substrate. Being located along the curved portion 218 disposes the peripheral pixels 232 laterally between the substrate 216 and the sidewall 232. As a further result, the peripheral pixels 232 are disposed at an angle relative to the surface 210 of the transparent cover 206 in this case. As shown in FIG. 2, the angle also varies in accordance with the lateral position of the pixels 232. Without compensation, the angle would lead to image distortion in the peripheral area 234 of the display 200, e.g., the viewer may see compression of the display content from pixels in the curved region due to the geometric effect of curvature.

To avoid such distortion and reduce the display border, light emitted from the pixels 232 in the peripheral area 234 is redirected by the fibers 228 of the guide plate 226. The fibers within the guide plate 226 have high refractive index compared to the lower refractive index of the cladding binder matrix. EMA (Extra-Mural Absorption) fibers may be included sparsely within the guide plate in order to absorb and reject ambient light as well as to increase contrast of the display light by absorbing high angle light that did not couple into the fibers, such as light entering cladding regions, which are non-guiding regions having finite fill factor. In order to provide higher efficiency, thus less impact on uniformity of luminance output across non-guided pixels and guided peripheral pixels regions of display, it is useful to use guide plates having high fill factor of fiber cores and low fill factor of cladding. Glass fiber faceplate media providing as high as 90% efficiency may be used. Polymer fiber faceplate media providing higher than 70% efficiency may alternatively be used, and such efficiency may be further increased by use of lower cladding fill factors. The fibers 228 are oriented such that light emitted from the peripheral pixels 232 is directed toward the display normal 208. The fibers 228 are sized so that an image presented by the peripheral pixels 232 at the rear surface 230 of the guide plate 226 is mapped to the front surface 231 of the guide plate 226. For example, the fibers 228 may have a pitch on the order of the pixels 232. The average fiber pitch may fall in a range from about 3 microns to about 35 microns. Average pitch significantly above that range may result in excessive sparkle effects for, e.g., an OLED display with 60-70 micron pixel spacing. Display sparkle may become emphasized, or increased, when choice of fiber average pitch is too large relative to sub-pixel size and/or when fill factor of the low refractive index cladding is too high, such that light sampling versus position across the display becomes inconsistent for each neighboring pixel, as light coupling may vary per pixel or sub-pixel, thus causing variation in apparent luminance of pixels exiting the surface of the guide plate 226. The fiber pitch may vary in accordance with, for instance, the desired resolution of the display 200. In some cases, the fiber pitch is smaller (e.g., significantly smaller) than the pixel pitch to maintain pixel fidelity. The guide plate 226 may accordingly be considered to provide coherent guiding or redirection of the image light in a manner such that the relative lateral pixel positions are mapped from the peripheral pixels to the exit surface of the guide plate 226, thereby providing substantially a continuous plane of pixels to the edge of the display.

The fibers 228 are oriented in parallel with one another. The extent to which the light is redirected by the fibers 228 accordingly varies with the lateral position of the peripheral pixels 232 along the curved portion 218. For instance, the fibers 228 provide more redirection as the peripheral pixels 232 approach the sidewall 212. Coherent fiber bundles may be hot drawn in order to substantially maintain a coherent mapping of relative lateral position of all fibers, thus a straight or linear translation in that dimension may be provided by shaping such type coherent fiber bundles. In some cases, mapping involves a coherent fiber bundle having curvature to the draw, such that each pixel normal angle is not only mapped to the corresponding exit position at exit surface of guide plate, but further redirects output angle to match normal exit angle as well. In the example shown, however, a tilt angle falling in a range from about 20 degrees to about 25 degrees toward corner may provide reasonable mapping with limitations in pointing of peak luminance for some embodiments.

The fibers 228 may or may not align with the peripheral pixels 232. For instance, the fibers 228 may or may not have a pitch equal to the pitch of the pixels 232. The core/cladding boundaries of the fibers 228 may thus not be positioned between the pixels 232 as shown in FIG. 2.

The fibers 228 may or may not be oriented in parallel with the display normal 208. While orientation of fibers may be set parallel to the display normal, such orientation may not provide for lateral mapping of an offset toward the corner (or edge), and thus can translate pixel light to exit surface, but involves use of more arc of the curved region of pixels in order to reduce the apparent size of border width. By orienting the fibers at an angle biased toward the corner of display module, geometric leverage may be utilized to translate pixel light from peripheral pixels to the exit surface of the guide plate into the corner (or edge), thereby significantly reducing border width, while using less arc length along the display, which also provides less pointing errors of peak luminance output. In this example, each fiber 228 is oriented at an angle relative to the display normal 208. The angled orientation of the fibers 228 nonetheless compensates for the angled disposition of the peripheral pixels 232. The angled orientation of the fibers 228 may also be useful for achieving a borderless display by directing light from the outermost peripheral pixels out in front of the sidewall 212. The extent to which the orientation is angled may vary.

The fibers 228 may be composed of polymer materials. A polymer-based composition may be useful for defining the rear and front surfaces 230, 232. Nevertheless, other materials may be used, including, for instance, glass-based compositions.

In the example of FIG. 2, the display 200 also includes masking 240 disposed along an interior surface of the sidewall 212. In some cases, the masking 240 includes a light-absorbing black mask, such as screened black ink or ink bump printing, which absorbs scattered light, outside acceptance angle of the fiber guide plate media, which may improve display contrast. The masking 240 is positioned alongside the outermost pixels 232 and configured to absorb light from the peripheral pixels 232 not guided by the fibers 228. Some of the light emitted from the peripheral pixels 232 is disposed at an angle greater than an acceptance angle of the fiber. Absorption of such light by the masking 240 avoids the distortion that would otherwise occur after reflection of such light off of the interior surface of the sidewall 212.

The display 200 may include alternative or additional components to avoid image blurring that would otherwise result from light not being guided by the fibers 228. For example, the guide plate 226 may include extra mural absorption (EMA) glass between adjacent fibers 228. The EMA glass absorbs the non-guided light so that secondary or blurred images are not emitted by the display 200. Polymer fiber faceplate media may include EMA functionality as well, e.g., in the form of black absorbing polymer fibers, such as polycarbonate or acrylic having visibly black or grey dye.

The display 200 may include further elements directed to edge emission compensation. In this example, the display 200 also includes a prismatic layer 242 configured to improve or address the view angle near the edge 212. The prismatic layer 242 is disposed on the front surface 231 of the guide plate 226. The prismatic layer 242 provides prismatic correction of the bias angle established by the angle at which the front surface 231 is cut. That cut angle causes the light emitted from the peripheral pixels to exhibit a bias angle offset from the display normal 208. The prismatic layer 242 is configured to shift the bias angle toward the display normal 208. In some cases, the prismatic layer 242 includes a film laminated to the guide plate 226. The prismatic layer 242 may implement the redirection via total internal reflection or refraction. In other embodiments, the prismatic structure may be diamond machined directly into the surface of the shaped fiber-optic faceplate media, which may include either the light exit surface alone or the light input surface alone, or both light input and light exit surfaces.

Figure 3:
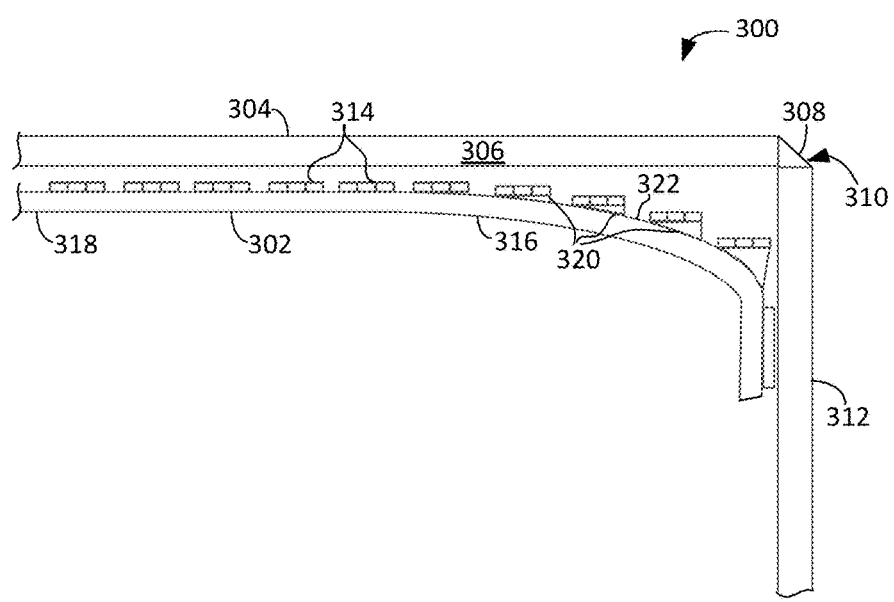
FIG. 3 is a partial, schematic, side view of a display having a substrate with surface banking for edge emission compensation in accordance with one example.

FIG. 3 depicts a display 300 that provides edge emission compensation in accordance with another example. The display 300 may be similarly configured to the above-described displays in several respects, including, for instance, a display module 302 and a cover 304. The display module 302 includes a curved portion 304 behind a transparent cover 306 of the cover 304. In this case, the cover 304 also includes a bezel 308 along an edge 310 of the display 300. The bezel 308 may couple the transparent cover 306 to a sidewall 312 of the cover 304. With the bezel 308, the display 300 provides an example in which the edge emission compensation presents a reduced border area, rather than a zero border display.

In the example of FIG. 3, the edge emission compensation is provided via a structural reorientation of peripheral pixels 314 of the display module 302. The peripheral pixels 314 are disposed on a curved portion 316 of a substrate 318, as described above. The peripheral pixels 314 are reoriented in the curved portion by non-uniformities 320 along a surface 322 of the substrate 318. Each non-uniformity 320 may include a banked portion of the surface 322. The banked surface is shaped to prop up or otherwise reorient one or more of the peripheral pixels 314 so that light emitted from the pixel is directed toward the display normal. The reorientation may or may not result in the light being primarily directed along the display normal. As described further herein, the reorientation may be utilized by itself or in conjunction with a guide plate, in which the required or desired pointing angle versus pixel position may vary.

In this case, each non-uniformity 320 includes a wedge-shaped projection. Other types of projections, banked surfaces, and non-uniformities may be used to compensate for a curvature of the curved portion 316 to direct light from the peripheral pixels 314 toward the normal of the display. For instance, examples of other banked surfaces are described and shown below in connection with FIG. 4.

The extent to which the non-uniformities 320 are banked varies in accordance with lateral position of the peripheral pixels 314 along the curved portion 316. Varying the banking allows the non-uniformities 320 to vary the extent to which the pixel 314 is reoriented. As shown in FIG. 3, the curvature of the curved portion 316 increases as the proximity to the sidewall 312 decreases. The size of the non-uniformities 320 accordingly increases as the proximity to the sidewall 312 decreases. The non-uniformities 320 thereby increasingly compensate for the increasing curvature of the curved portion 316.

The projection of each non-uniformity 320 may be formed via a stamping procedure. For example, a polymer or other material may be fused or otherwise affixed to the substrate 318 prior to the formation of the pixels 314. The non-uniformities 320 may be formed on a pixel-by-pixel basis or for each row or column in the pixel array. Other procedures may be used. For instance, the non-uniformities 320 may be formed via controlled deposition, photolithography, and/or other micro-fabrication procedures.

Figure 4:
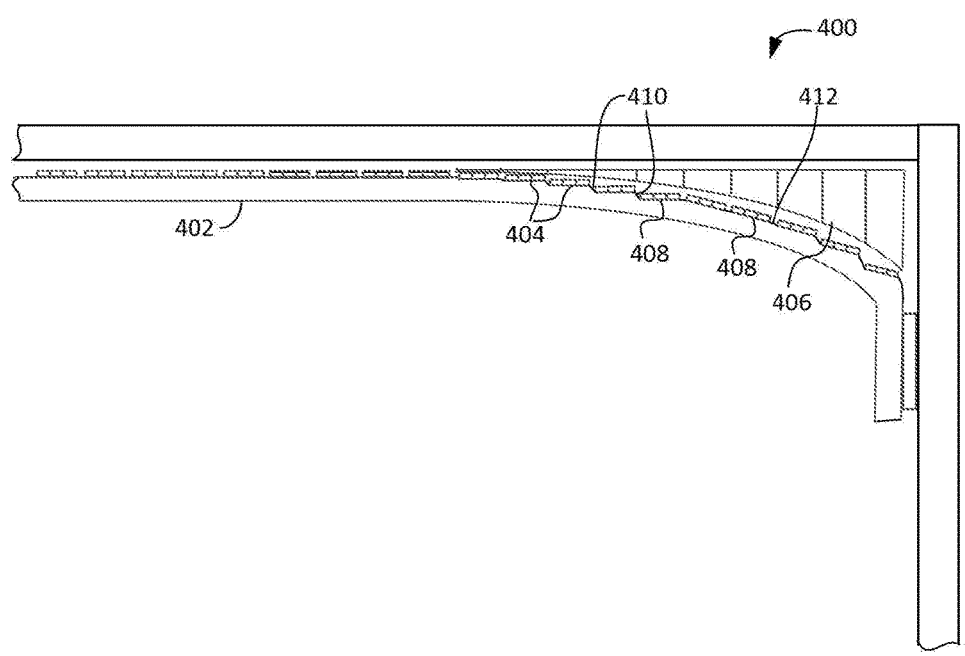
FIG. 4 is a partial, schematic, side view of a display having edge emission compensation via both a coherent guide plate and substrate surface banking in accordance with one example.

FIG. 4 depicts a display 400 that provides edge emission compensation in accordance with an example that combines the compensation mechanisms described above. The display 400 compensates for the curvature of a curved substrate portion 402 both optically and via structural reorientation of peripheral pixels 404 disposed on the curved substrate portion 402. The display 400 includes a coherent guide plate 406 configured to provide optical compensation and substrate non-uniformities 408 for the peripheral pixels 404. The combination of the optical and structural compensation mechanisms allows each mechanism to provide a portion of the compensation. Greater amounts of redirection can be attained. Alternatively or additionally, the demands placed on either mechanism alone are thereby lessened. The guide axis of the coherent guide plate 406 may be aligned to the normal of the display 400 or may be biased toward the corner (or the edge) of the display 400.

The coherent guide plate 406 may be configured as described in connection with the other examples described herein. For example, the coherent guide plate 406 may include a fiber optic faceplate. Other types of coherent guides may be used, including, for instance, photonic crystal structures, examples of which are described and shown in connection with FIGS. 5 and 6.

The substrate non-uniformities 408 reorient the peripheral pixels 404 such that light emitted from the pixels 404 is directed toward the display normal. Each substrate non-uniformity 408 again establishes a respective banked surface on which one or more of the peripheral pixels 404 are disposed. Each banked surface is configured to structurally compensate for a curvature of the curved substrate portion 402 to direct light from the peripheral pixels toward the display normal. In this case, each non-uniformity 408 includes a respective indent 410 in a surface 412 of the curved substrate portion 402. Each indent 410 has a surface banked with respect to the substrate surface 412. In the example of FIG. 4, the extent to which the indent 410 is banked varies with the lateral position of the peripheral pixels 404. The indent 410 presents an increasingly banked surface for pixels closer to the edge, i.e., as the curvature of the substrate portion 402 increases.

The respective contributions of the optical redirection and structural pixel reorientation may vary. For instance, increasing the contribution from the coherent guide plate 406 may reduce the severity of one or more of the banked surfaces of the substrate non-uniformities 408. This may be useful, for instance, with the peripheral pixels 404 closest to the edge and, thus, positioned where the substrate curvature is greatest. Conversely, the reorientation of the peripheral pixels 404 may relax the demands placed upon the coherent guide plate 406. For instance, the range of acceptance angles may be reduced.

The combination of the optical redirection and structural pixel reorientation in the example of FIG. 4 may also lead to greater alignment with the display normal. The combination of the optical redirection and the structural reorientation allows a desired angle to be achieved. For useful acceptance and exiting, both the deviation between the fiber input tilt angle and the pixel light emitting pointing angle may impact exit angular profile and pointing angle. For example, extremely high input angles may cause bias toward high angle guiding, and in some cases cause donut-shaped angular output profiles. By controlling the angle between pixel peak luminance angle and fiber input face angle, such deformations of exit profile at exit surface of guide plate may be reduced. Light may be considered to be directed substantially along the display normal, so as to improve apparent uniformity across main display and the transferred or mapped peripheral pixels, when a viewer is unable to discern a difference between such light and light oriented exactly along the display normal. However, in cases where high angle coupling or absorption or Fresnel losses results in loss in peak luminance due to angular redistribution or transmission losses, pixels within the peripheral region may be electronically boosted with an increased drive in order to maintain uniformity across the main display and the peripheral pixels. For instance, an OLED display may support a normal mode and a bright mode, such that some portion of dynamic range of the OLED luminance for bright mode may be utilized within the peripheral region to provide uniformity as apparent to a viewer of the main display plane for normal mode.

The above-described displays may have further features directed to edge emission compensation. For instance, the displays may have varying pixel spacing. As shown in, for example, FIG. 4, the spacing along the curved substrate portion 402 between adjacent pixels 404 of the peripheral pixels 404 increases as the lateral distance of the peripheral pixel 404 from the edge decreases. The spacing along the substrate surface increases to maintain the effective spacing of the light emitted from the pixels 404. The spacing changes in accordance with the curvature of the curved substrate portion 402 so that the lateral axis component of the spacing remains constant.

The above-described displays may also adjust the luminance of one or more pixels to compensate for the emission along the periphery of the display. For example, the above-described display modules may be configured to boost a luminance level of the peripheral pixels. A boosted luminance level is increased an amount over the original level at which the pixel would otherwise be operating. The amount may vary in accordance with the lateral distance of the peripheral pixel from the edge. The amount increases as the lateral distance from the edge decreases because pixels closer to the edge may direct a greater fraction of emitted light offset from the display normal, e.g., due to the increased substrate curvature. For each pixel, the amount may be fixed or variable (e.g., a percentage of the unadjusted, original luminance level).

Further mechanisms or techniques for improving display contrast along the display edge may involve (i) incorporating low index fill in the optical stack of the display module and/or (ii) wetting of both front and rear surfaces of the guide plates. By matching the refractive index of multiple layers of the various layers within the optical stack, optical artifacts may be reduced. For instance, optical bonding using an index of refraction that matches the average refractive index of the core and cladding of the fiber faceplate media may be used to minimize visibility of such interface to a viewer. In other embodiments, the refractive index of the optical bond layer may be chosen to match either the cladding or the core refractive index.

Figure 5:
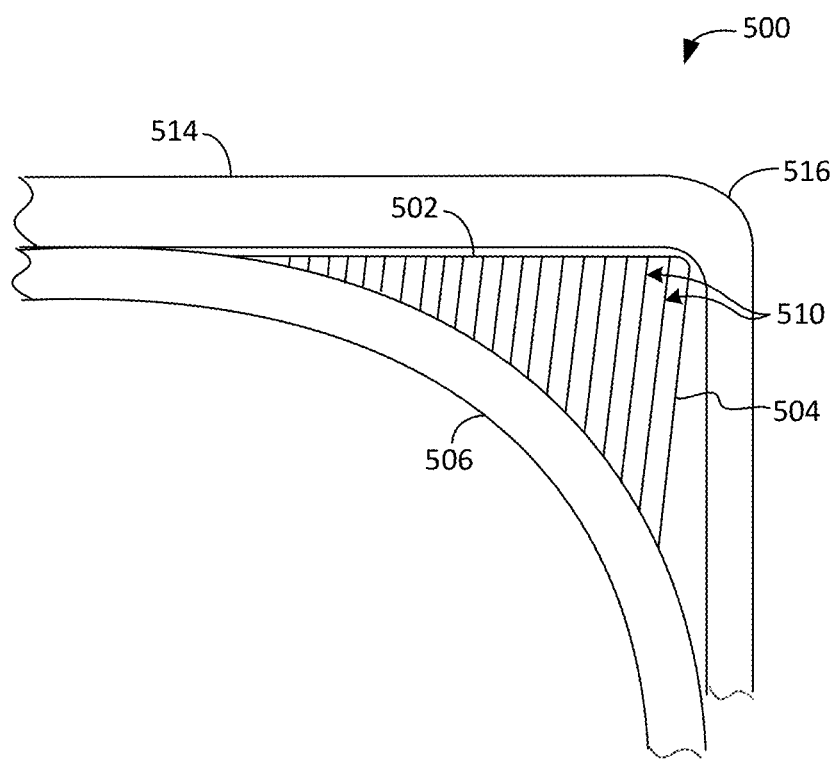
FIG. 5 is a partial, schematic, side view of a display having a photonic crystal guide plate for edge emission compensation in accordance with one example.

FIG. 5 depicts a display 500 having a guide plate 502 for optical edge emission compensation. As in the above-described examples, the guide plate 502 includes a number of structures 504 that coherently guide the light emitted from a display module 506. In this case, the structures 504 do not include a fiber optic faceplate or otherwise rely on a fiber bundle. The structures 504 instead guide the light via two-dimensional transverse Anderson localization. The structures 504 guide the light without a core-cladding framework, as in fiber optic bundles. The structures 504 instead use a randomized, disordered medium of mismatched refractive indices extruded in the direction in which the light is to be guided. The structures 504 may be sized (or have features) on the order of the wavelength of the light. The light can enter the medium from any angle, after which the light settles on a mode and is accordingly guided in the extrusion direction. The guide plate 502 may be useful in cases in which the acceptance angle of a fiber optic faceplate may be too limiting. Further, such type guide plate media may be highly efficient, such as better than 90% transmission, as the media does not have cladding losses, and no sparkle issues, because guiding features are on order of the wavelength of the light. Another useful property is that light launched at the side of such media is efficiently reflected, which may be used to improve contrast, without relying on EMA glass.

The transverse Anderson localization-based structures 504 may provide increased display contrast for reasons in addition to the lack of acceptance angle limitations. For instance, the structures 504 do not include cladding, extra mural absorption (EMA) glass, or other materials that absorb light that could otherwise provide contrast. The structures 504 in this example thus avoid the intrinsic losses presented by fiber-based photonic crystal structures. Without those losses, the resulting image is not as pixelated and nearly all of the light is guided.

In some cases, the medium of the structures 504 have element sizes less than 1 micron (e.g., nanostructures). The medium of the structures 504 may be composed of polystyrene and polymethyl methacrylate (PMMA) and/or various dielectric materials. The regions of polystyrene and PMMA are randomly distributed before extrusion.

Figure 6:
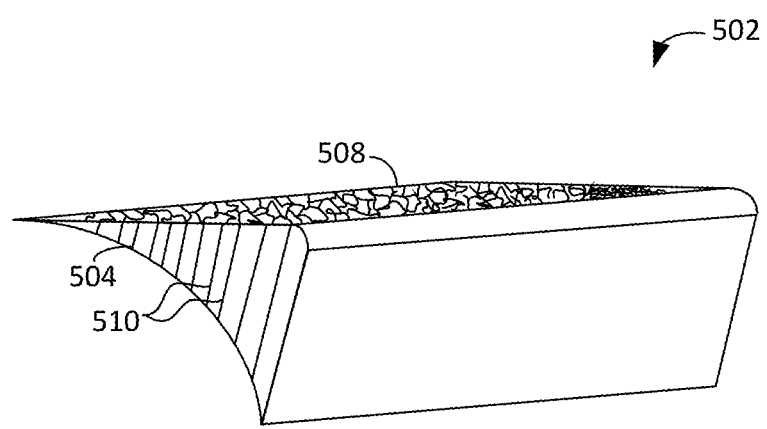
FIG. 6 is a partial, schematic, perspective view of a photonic crystal guide plate of the display of FIG. 5 in accordance with one example.

The guide plate 502 and the structures 504 thereof are shown in greater detail in FIG. 6. The randomized, disordered medium of the guide plate 502 is schematically shown along a face 508 of the guide plate 502. The extrusion of the medium results in tube-like extensions 510 oriented in the desired direction. The tube-like extensions 510 are also shown in FIG. 5.

The results of the extrusion are then machined or otherwise cut to form the shape of the guide plate 502. For instance, the face 508 of the guide plate 502 may be cut and polished. A curved surface 512 opposite the face 508 may be machined to match the curvature of the substrate.

As shown in FIG. 5, the display 500 has a transparent cover 514 with a rounded corner or edge 516. The rounded nature of the edge 516 may be used to optically redirect light from a corner of the shaped guide plate (which may be rounded as shown) to appear to emanate from the edge of the cover lens, cover glass or other cover. In such case, the main exit surface of the guide plate provides the continuous plane of pixels, but only to the edge of the guide plate. By adding a small radius or curvature to the exit corner of the guide plate and an offset larger radius on cover 514, content around the small rounded corner of guide plate may be mapped optically all the way to edge of display, using the optical power of the corner of the curved coverlens to redirect corner display light toward viewer. The rounded edge 516 may be incorporated into any of the displays described herein.

Other types of coherent guide plates may be used. For instance, the guide plates may include photonic crystal structures or media. For instance, the displays described herein may include various shaped photonic crystal media fabricated by various techniques. For example, the media may be periodic drawn, etched or lithographed media having a nanostructured or other pattern mismatched index regions. Examples include polycrystalline fiber (PCF), deep etched lithographed media, and other photonic crystal guiding two-dimensional pattern drawn, extruded, etched, or otherwise processed along the propagation direction.

Figure 7:
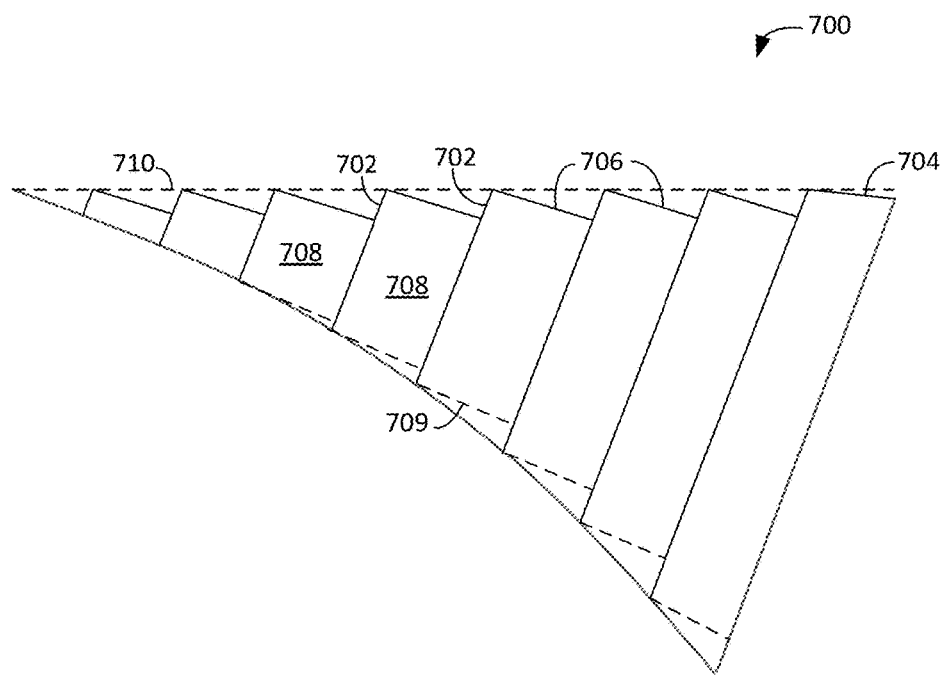
FIG. 7 is a partial, schematic, side view of a notched guide plate in accordance with one example.

FIG. 7 depicts a fiber optic or other coherent guide plate 700 with notches 702 in a front face 704 for view angle improvement. The notches 702 may be configured as prism cuts to provide prismatic correction of the light via the fiber optic guide plate 700. The notches 702 thus square off an upper end 706 of each fiber 708 to avoid presenting an exit surface with an angled face that would otherwise results in a bias angle offset from the display normal. In some cases, each fiber 708 may also or alternatively have a notch 709 along the lower ends that matches the notches 702 in the upper ends 706. The notch cut pattern may be diamond machined.

The notches 702, 709 may be filled. For example, the material filling the notches 702, 709 may be laminated on the guide plate. In some cases, the laminated fill includes optically clear resin (OCR) material.

The pitch of the notch cut pattern(s) may be selected so as to avoid aliasing effects. For instance, the notch pattern pitch may be smaller than the display pixel spacing. In cases in which transverse Anderson localization media is used, the pitch of the notch cut pattern may be on the order of one-half to one-quarter of the display pixel spacing. For example, the pitch of the notch cut pattern may fall in a range from about 15 microns to about 35 microns for a pixel spacing falling in a range from about 60 microns to about 70 microns.

Correcting the bias angle offset may improve both on-axis and right-bias angle contrast for the display in which the guide plate 700 is incorporated. If light is coupled off-axis at the input end, such as a tilt of the input face angle, then peak luminance angle of guided light may have a bias angle in propagation, such that if the output face angle has tilt, light may exit biased up and at laterally outward. By adding the prism structures to the exit surface, some of the peak luminance light, which may in some embodiments be donut in angular profile, may be biased back toward normal. Further, for cases using two-dimensional transverse Anderson localization media, the sidewalls are reflective, thus may redirect the outward pointing output closer to the normal of the display. By also or alternatively cutting the prism structures along the bottom input surface of the guide plate media, the deviation of peak luminance angle of emitting display pixels and propagation angle may be reduced so as to further reduce impact of angular exit profile at the exit surface of guide plate. In other cases, guide plate media, e.g., fiber optic guide plate or transverse Anderson localization media, may be used without notching, and/or used in conjunction with a prismatic array. The prismatic array may be located at the exit surface of the guide media, the input surface of the guide media, or both locations.

While coherent guide plate 502 involves an extruded or drawn two-dimensional pattern of dissimilar refractive index optical guiding media, such as two-dimensional transverse Anderson localization media or fiber optic faceplate media or photonic crystal media, to transfer and maintain display content light to the exit surface of the media in both lateral dimensions (e.g., x and y) across the main display plane, in order for display content within periphery region to appear to emanate from the main plane of display, other examples may include one-dimensional guiding media, such that features guide display content light within any plane containing the radius of curvature, yet allow divergence in the orthogonal dimension. Use of one-dimensional guiding media may provide position transfer for pixels along the periphery, while allowing z position to emanate from a z position below the main plane of the display. In such scenario, distortion across the arc may be controlled or limited as pixels appear to emanate at the expected position as if a continuum of pixels to the display edge, but the apparent depth of those pixels vary with the optical path length to the input surface of guide media, such that on-axis viewing may be acceptably corrected, but viewing at a bias angle in a plane orthogonal to the plane containing arc radius may appear as a book-binder seam to such vantage point of viewer. Thus, a one-dimensional version of guide plate media, such as one-dimensional fiber optic faceplate media, where core and cladding become a stack of high and low index alternating film layers, or such as one-dimensional version of transverse Anderson localization media, or such as one-dimensional version of photonic crystal media, may be used to achieve guiding in one dimension to maintain pixel mapping to the display edge, without requiring two-dimensional coupling and propagation to the main display plane.

Figure 8:
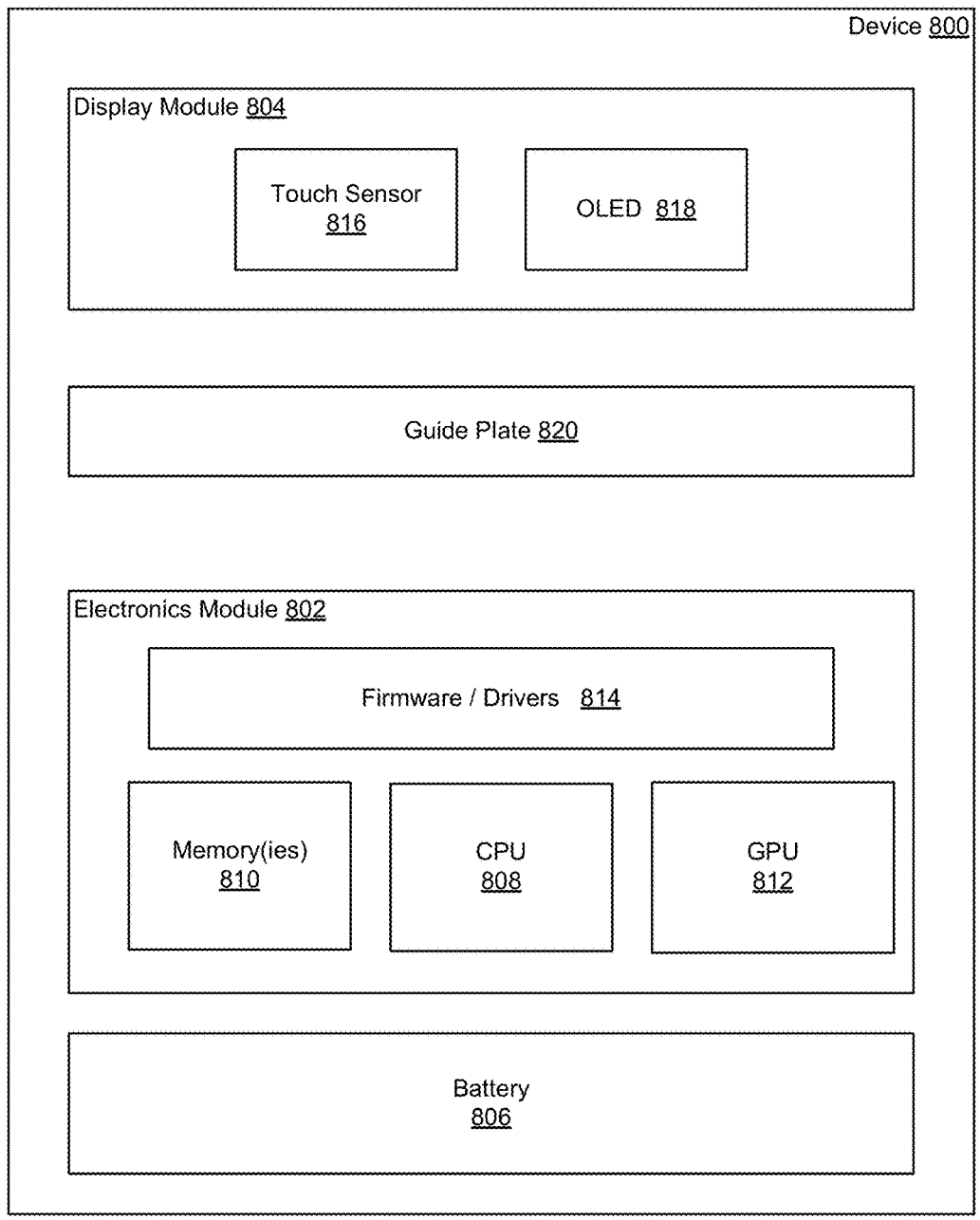
FIG. 8 is a block diagram of an electronic device having a display with edge emission compensation in accordance with one example.

FIG. 8 shows an electronic device 800 in which edge emission compensation of the above-described examples may be incorporated in connection with a display. The electronic device 800 has an electronics module 802 and a display module 804, and a battery 806. The electronic device 800 may include additional, fewer, or alternative components. For example, the display module 804 may be integrated with the electronics module 802 and/or other components of the electronic device 800 to a varying extent. For instance, the electronics module 802 and/or the display module 804 may include a graphics subsystem of the electronic device 800. Any number of display modules or systems may be included. In this example, the device 800 includes a processor 808 and one or more memories 810 separate from the display module 804. The processor 808 and the memories 810 may be directed to executing one or more applications implemented by the device 800. The display module 804 generates a user interface for an operating environment (e.g., an application environment) supported by the processor 808 and the memories 810. The processor 808 may be a general-purpose processor, such as a central processing unit (CPU), or any other processor or processing unit. Any number of such processors or processing units may be included.

In the example of FIG. 8, the electronics module 802 includes a graphics processing unit (GPU) 812 and firmware and/or drivers 814. The GPU 812 may be dedicated to graphics- or display-related functionality and/or provide general processing functionality, which may or may not include graphics-related processing in connection with, for instance, touch sensing. Some of the components of the electronics module 802 may be integrated. For example, the processor 808, the one or more of the memories 810, the GPU 812, and/or the firmware 814 may be integrated as a system-on-a-chip (SoC) or application-specific integrated circuit (ASIC). The electronics module 802 may include additional, fewer, or alternative components. For example, the electronics module 802 may not include a dedicated graphics processor, and instead rely on the CPU 808 or other general-purpose processor to support the graphics-related functionality of the electronic device 800. The electronics module 802 may include additional memory (or memories) to support display-related and/or fingerprint detection processing.

In the example of FIG. 8, the display module 804 includes a touch sensor 816 and an OLED or unit panel 818. The touch sensor 816 may be a capacitive touch sensor, a resistive touch sensor, or other type of touch sensor. Other types of emissive display panels or units may be used. For example, a flexible LCD panel may be used.

A guide plate 820 is disposed along the display module 804 and configured for edge emission compensation as described above. Other mechanisms may be alternatively or additionally used for the edge emission compensation, as described above.

Additional, fewer, or alternative display components may be provided. For example, in some cases, the display module 804 does not include a touch sensor unit or a guide plate. In some cases, the display module 804 includes a backlight unit.

The device 800 may be configured as one of a wide variety of computing devices, including, but not limited to, handheld or wearable computing devices (e.g., tablets and watches), communication devices (e.g., phones), laptop or other mobile computers, personal computers (PCs), and other devices. The device 800 may also be configured as an electronic display device, such as a computer monitor, a television, or other display or visual output device. In such cases, the device 800 may not include one or more of the above-described components, such as the battery 806.

In one aspect, a display includes a cover including a front face that defines a normal of the display and further including a sidewall that meets the front face to define an edge of the display, a display module disposed behind the cover, the display module including a substrate and further including a plurality of pixels supported by the substrate. The substrate includes a curved portion along the edge, the curved portion bending rearward such that peripheral pixels of the plurality of pixels are disposed laterally between the substrate and the sidewall. The display includes edge compensation means for compensating for a curvature of the curved portion to direct light from the peripheral pixels toward the normal of the display. An extent to which the edge compensation means compensates for the curvature varies in accordance with lateral position of the peripheral pixels along the curved portion.

In another aspect, a display includes a cover comprising a front face that defines a normal of the display and further includes a sidewall that meets the front face to define an edge of the display, a display module disposed behind the cover, the display module including a substrate comprising a curved portion in which peripheral pixels of the plurality of pixels are disposed along the edge, a plurality of pixels supported by the substrate; and control circuitry supported by the substrate, the control circuitry disposed at, and oriented along, the sidewall. The display further includes a guide plate disposed between the display module and the cover along the edge, the guide plate configured to redirect light from the peripheral pixels toward the normal of the display.

In yet another aspect, a display includes a substrate and a plurality of pixels supported by the substrate, the plurality of pixels distributed across the substrate to define a display area with a periphery. The substrate includes a curved portion in the periphery in which peripheral pixels of the plurality of pixels are disposed. The substrate includes non-uniformities for the peripheral pixels. Each non-uniformity establishes a respective banked surface on which one or more of the peripheral pixels are disposed, each banked surface configured to compensate for a curvature of the curved portion to direct light from the peripheral pixels toward the normal of the display.

In connection with any one of the aforementioned aspects, the displays may alternatively or additionally include any combination of one or more of the following aspects or features. The display module further includes control circuitry supported by the substrate, wherein the control circuitry is disposed at, and oriented along, the sidewall. The edge compensation means optically compensates for the curvature of the curved portion. The edge compensation means includes a coherent guide plate that redirects and transfers the light from the peripheral pixels. The extent to which the light is redirected by the edge compensation means varies in accordance with the lateral position of the peripheral pixels along the curved portion. The edge compensation means compensates for the curvature of the curved portion via a structural reorientation of the peripheral pixels. The edge compensation means includes a banked surface of the substrate. The extent to which the pixels are banked varies in accordance with the lateral position of the peripheral pixels along the curved portion. The edge compensation means includes a coherent guide plate configured to optically compensate for the curvature of the curved portion, and a banked surface of the substrate configured to structurally compensate for the curvature of the curved portion. A spacing along the substrate between adjacent pixels of the peripheral pixels increases as a lateral distance of the peripheral pixel from the edge decreases. The display module is configured to boost a luminance level of the peripheral pixels. The guide plate includes a photonic crystal structure that coherently guides the light. The guide plate includes a polymer fiber optic faceplate. The photonic crystal structure guides the light via transverse Anderson localization. The display further including a prismatic layer disposed on the guide plate. The substrate includes a plurality of banked surfaces on which the peripheral pixels are disposed. The extent to which the non-uniformities are banked varies in accordance with lateral position of the peripheral pixels along the curved portion. Each non-uniformity includes a respective indent in a surface of the substrate.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A display comprising:
a cover comprising a front face that defines a normal of the display and further comprising a sidewall that meets the front face to define an edge of the display;
a display module disposed behind the cover, the display module comprising a substrate and further comprising a plurality of pixels supported by the substrate, wherein the substrate comprises a curved portion along the edge, the curved portion bending rearward such that peripheral pixels of the plurality of pixels are disposed laterally between the substrate and the sidewall; and
edge compensation means for compensating for a curvature of the curved portion to direct light from the peripheral pixels toward the normal of the display, the edge compensation means comprising a plurality of structures configured to coherently guide the light, each structure of the plurality of structures not oriented in parallel with the normal of the display;
wherein an extent to which the edge compensation means compensates for the curvature varies in accordance with lateral position of the peripheral pixels along the curved portion.

2. A display comprising:
a cover comprising a front face that defines a normal of the display and further comprising a sidewall that meets the front face to define an edge of the display;
a display module disposed behind the cover, the display module comprising a substrate and further comprising a plurality of pixels supported by the substrate, wherein the substrate comprises a curved portion along the edge, the curved portion bending rearward such that peripheral pixels of the plurality of pixels are disposed laterally between the substrate and the sidewall; and
edge compensation means for compensating for a curvature of the curved portion to direct light from the peripheral pixels toward the normal of the display;
wherein an extent to which the edge compensation means compensates for the curvature varies in accordance with lateral position of the peripheral pixels along the curved portion,
wherein the display module further comprises control circuitry supported by the substrate, and
wherein the control circuitry is disposed at, and oriented along, the sidewall.

3. The display of claim 1, wherein the edge compensation means optically compensates for the curvature of the curved portion.

4. The display of claim 3, wherein the edge compensation means comprises a coherent guide plate that redirects and transfers the light from the peripheral pixels.

5. The display of claim 4, wherein the extent to which the light is redirected by the edge compensation means varies in accordance with the lateral position of the peripheral pixels along the curved portion.

6. A display comprising:
a cover comprising a front face that defines a normal of the display and further comprising a sidewall that meets the front face to define an edge of the display;
a display module disposed behind the cover, the display module comprising a substrate and further comprising a plurality of pixels supported by the substrate, wherein the substrate comprises a curved portion along the edge, the curved portion bending rearward such that peripheral pixels of the plurality of pixels are disposed laterally between the substrate and the sidewall; and
edge compensation means for compensating for a curvature of the curved portion to direct light from the peripheral pixels toward the normal of the display;
wherein an extent to which the edge compensation means compensates for the curvature varies in accordance with lateral position of the peripheral pixels along the curved portion, and
wherein the edge compensation means compensates for the curvature of the curved portion via a structural reorientation of the peripheral pixels.

7. The display of claim 6, wherein the edge compensation means comprises a banked surface of the substrate.

8. The display of claim 7, wherein an extent to which the pixels are banked via the banked surface varies in accordance with the lateral position of the peripheral pixels along the curved portion.

9. A display comprising:
a cover comprising a front face that defines a normal of the display and further comprising a sidewall that meets the front face to define an edge of the display;
a display module disposed behind the cover, the display module comprising a substrate and further comprising a plurality of pixels supported by the substrate, wherein the substrate comprises a curved portion along the edge, the curved portion bending rearward such that peripheral pixels of the plurality of pixels are disposed laterally between the substrate and the sidewall; and
edge compensation means for compensating for a curvature of the curved portion to direct light from the peripheral pixels toward the normal of the display;
wherein an extent to which the edge compensation means compensates for the curvature varies in accordance with lateral position of the peripheral pixels along the curved portion,
wherein the edge compensation means comprises:
a coherent guide plate configured to optically compensate for the curvature of the curved portion; and
a banked surface of the substrate configured to structurally compensate for the curvature of the curved portion.

10. A display comprising:
a cover comprising a front face that defines a normal of the display and further comprising a sidewall that meets the front face to define an edge of the display;
a display module disposed behind the cover, the display module comprising a substrate and further comprising a plurality of pixels supported by the substrate, wherein the substrate comprises a curved portion along the edge, the curved portion bending rearward such that peripheral pixels of the plurality of pixels are disposed laterally between the substrate and the sidewall; and
edge compensation means for compensating for a curvature of the curved portion to direct light from the peripheral pixels toward the normal of the display;
wherein an extent to which the edge compensation means compensates for the curvature varies in accordance with lateral position of the peripheral pixels along the curved portion, and
wherein a spacing along the substrate between adjacent pixels of the peripheral pixels increases as a lateral distance of the peripheral pixel from the edge decreases.

11. The display of claim 1, wherein the display module is configured to boost a luminance level of the peripheral pixels.

12. A display comprising:
a cover comprising a front face that defines a normal of the display and further comprising a sidewall that meets the front face to define an edge of the display;
a display module disposed behind the cover, the display module comprising:
 a substrate comprising a curved portion in which peripheral pixels of the plurality of pixels are disposed along the edge;
 a plurality of pixels supported by the substrate; and
 control circuitry supported by the substrate, the control circuitry disposed at, and oriented along, the sidewall; and
a guide plate disposed between the display module and the cover along the edge, the guide plate configured to redirect light from the peripheral pixels toward the normal of the display.

13. The display of claim 12, wherein the guide plate comprises a photonic crystal structure that coherently guides the light.

14. The display of claim 12, wherein the guide plate comprises a polymer fiber optic faceplate.

15. The display of claim 12, wherein the guide plate is configured to guide the light via transverse Anderson localization.

16. The display of claim 12, further comprising a prismatic layer disposed on the guide plate.

17. The display of claim 12, wherein the substrate comprises a plurality of banked surfaces on which the peripheral pixels are disposed.

18. A display comprising:
a substrate; and
a plurality of pixels supported by the substrate, the plurality of pixels distributed across the substrate to define a display area with a periphery;
wherein:
 the substrate comprises a curved portion in the periphery in which peripheral pixels of the plurality of pixels are disposed;
 the substrate comprises non-uniformities for the peripheral pixels; and
 each non-uniformity establishes a respective banked surface on which one or more of the peripheral pixels are disposed, each banked surface configured to compensate for a curvature of the curved portion to direct light from the peripheral pixels toward the normal of the display.

19. The display of claim 18, wherein the extent to which the non-uniformities are banked varies in accordance with respective lateral positions of the peripheral pixels along the curved portion.

20. The display of claim 18, wherein each non-uniformity comprises a respective indent in a surface of the substrate.

21. The display of claim 4, wherein the coherent guide plate comprises a photonic crystal structure.

22. The display of claim 4, wherein the coherent guide plate is configured to guide the light via transverse Anderson localization.

* * * * *